United States Patent [19]

Foss

[11] Patent Number: 5,027,329

[45] Date of Patent: Jun. 25, 1991

[54] ADDRESSING FOR LARGE DYNAMIC RAM

[75] Inventor: Richard C. Foss, Kirkcaldy Fife, Scotland

[73] Assignee: Mosaid Inc., Canada

[21] Appl. No.: 445,448

[22] Filed: Dec. 4, 1989

[30] Foreign Application Priority Data

Dec. 5, 1988 [CA] Canada ................................. 585031

[51] Int. Cl.⁵ .............................................. G11C 13/00
[52] U.S. Cl. ............................ 365/230.02; 365/189.02
[58] Field of Search ....................... 365/189.02, 230.02

[56] References Cited

U.S. PATENT DOCUMENTS 4,754,433  6/1988  Chin et al ........................ 365/189.02
4,845,677  7/1989  Chappell et al. ................ 365/189.02

Primary Examiner—Terrell W. Fears
Attorney, Agent, or Firm—Laff, Whitesel, Conte & Saret

[57] ABSTRACT

A DRAM semiconductor memory chip comprised of a matrix of rows and columns having a bit storage cell at each location, means for receiving row and column address bits in multiplexed form on a single address bus, the multiplexing arrangement being such that the number of column address bits exceeds the number of row address bits, whereby a system using the DRAM memory chip has access to an enlarged page size.

21 Claims, 3 Drawing Sheets

ADDRESSING FOR LARGE DYNAMIC RAM

FIELD OF THE INVENTION

This invention relates to a dynamic semiconductor random access memory (DRAM) and in particular to an addressing structure therefor.

BACKGROUND OF THE INVENTION

DRAMs are typically organized into rows and columns (bit lines), with a bit stored at their intersections. By addressing a particular row and column the stored bit can be read by a sense amplifier connected to a column.

As the DRAM size, and thus the number of bits stored in a DRAM, has increased, addressing it has become more complex. For example in the very early (small) DRAMs (nominally 1K or 2K bits) both the rows and columns coould be addressed using a single address word. However once DRAMs reached the size of nominally 4K bits (4096 bits), address words for the rows and columns were multiplexed on an address bus. In a nominally 4K memory, for example, 6 bits in an address defined one selected row out of 64 possible rows and a further 6 bits defined one selected column out of 64 possible columns.

In more recently designed large memories, for example in a 1 megabit memory, 10 address bits define a row followed by 10 bits which define a column. The 1K (1024) bits defined by 10 column address bits is called a "page", and selection of data from this datafield without changing row address is called "page mode" operation.

At the intersection of each row and column is a transistor and capacitor, called a bit storage cell. As the number of cells per unit semiconductor substrate area increased, the tolerable ratio of cell capacitance to bit line capacitance set a practical limit of 256 cells connected to a bit line sense amplifier. The memory was therefore divided into blocks or groups. In a nominally 1 megabit memory, for example, each vertical (column) bit line in the matrix was divided into 8 blocks or groups, each being associated with 256 horizontal so called word lines. All of the bits stored at the intersection of a word line and all of the vertical bit lines forms a page.

In a typical 1 megabit chip, therefore, there cannot be simply 1024 bit lines and 1024 word lines. Because of the aforenoted capacitance ratio limitation there will be 8 blocks, each block having 256 word lines and 512 columns. As each column must be associated with a sense amplifier, such a typical memory chip thus has 4096 sense amplifiers. Because there are only 10 bits in a column address, page size is limited to 1024 bits.

Also, importantly, because of the peak current requirements from the power supply when all of the sense amplifiers associated with a particular word are to be accessed, all sense amplifiers could not be active when a row (word line) address change occurred. Some groups or blocks of words remain in a quiescent state.

With further increase in size of DRAMs, more of the memory will remain inactive and the difference between the number of sense amplifiers required and the accessible page sizes will become larger. For example, in a 16 megabit DRAM memory built using 12 bits for each of row and column address, a nominally 4K bit page size will be obtained, although 64K or more sense amplifiers are used. Depending on the adopted number of refresh cycles, not all of the sense amplifiers will be active at any one time.

With increases in processor speed, the page mode has become very important because the computing cycle is too short to allow both row and column addresses to be changed in one processor cycle.

SUMMARY OF THE INVENTION

The present invention is a structure in which large DRAMs can be addressed with a reduced word address size, and fast access to the various bits on a page.

In accordance with the present invention, the memory is divided into blocks as in the prior art. However, instead of using part of the row address to select, say, one out of 256 word lines and the remainder of the row address field to determine which block shall be accessed by the column address bits, an unequal division is made of the total address field (24 bits for a 16Mx1). Thus 8 bits may be used to select one out of 256 word lines in every block followed by 12 bits to select one bit from a page size of 64K bits. Thus the user has high speed access to a page of 64K bits rather than the 4K page size restriction following the prior art.

To achieve this advantage requires four additional address pins. In modern package styles such as that known as the SOJ (Small Outline J-lead) this does not reguire a physically larger package and is a minimal disadvantage. The peak current required to make all memory blocks active simultaneously becomes the limiting factor in the new arrangement. In this invention, the peak current problem may be alleviated by activating each memory block in a staggered time sequence following any change in row address. While this increases the row address access time, this is compensated by the greatly reduced probability of a row address change occuring thanks to the increased size of page.

Because of the phased sequential operation of the individual blocks following a row address change, it is also possible to interleave a refresh operation using an on-chip refresh system that is transparent to the user. There is no requirement for an interrupt or memory busy period to perform a refresh function. This provides further compensation to the user in return for the slower row access time relative to prior art memories.

Accordingly in the present invention a large DRAM is internally arranged in more than 1 block, whereby more than half the total number of address bits serve to provide access to a page of data. A single row address results in phased operation of all the blocks in memory.

According to another aspect of the invention, the phased delay in activating the row and sense amplifiers of sequentially selected blocks, from 1 row address allows a transparent refresh to occur, allowing the memory to appear as a pseudo or virtual-static memory.

BRIEF INTRODUCTION TO THE DRAWINGS

A better understanding of the invention will be obtained by reference to the detailed description below, in conjunction with the following drawings, in which:

FIG. 1 illustrates a storage cell in a typical DRAM,

FIG. 2 illustrates the layout of a small sized DRAM in accordance with the prior art, FIG. 3 illustrate the organization of a large size DRAM in accordance with the prior art, FIG. 4 illustrates the organization of the preferred embodiment of the present invention, FIG. 5 is a phasing diagram illustrating the phased operation of word line groups in accordance with the present invention, and FIG. 6 is a block diagram illustrating another embodiment of the present invention.

DESCRIPTION OF THE PREFERRED EMBODIMENT

Figure 1:
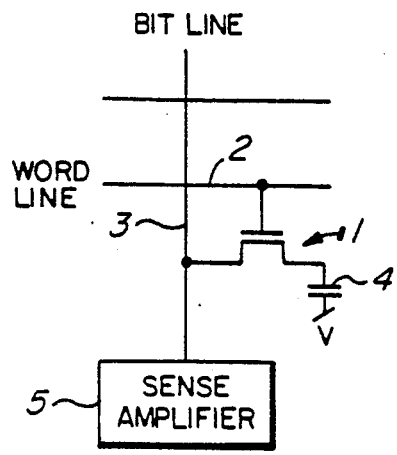

Turning first to FIG. 1, a typical memory cell is shown. The gate of a field effect transistor 1 is connected to a word line 2, while a source or drain of the transistor is connected to a bit line 3. The drain or source of the transistor is connected to a capacitor 4 which is connected to a source of potential V. The bit line 3 is also connected to a sense amplifier 5. When the bit line and word line to which transistor 1 is connected are addressed, transistor 1 is enabled, allowing capacitor 4 to discharge to the bit line. When the sense amplifier is subsequently enabled, it senses the change in bit line voltages and charge levels.

Figure 2:
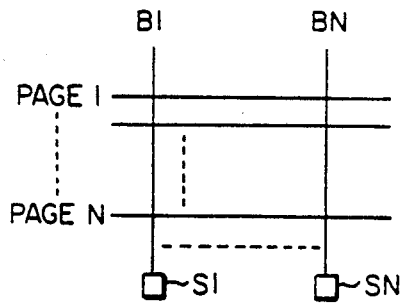

In a small memory, a matrix is formed of bit lines, referenced in FIG. 2 as B1-BN and word lines referenced as PAGE1-PAGEN. A transistor corresponding to transistor 1 of Figure 1 is connected to the bit and word lines at each matrix crossing. The bit storage capacity of the memory thus is determined by the number of bit lines multiplied by the number of word lines. Each bit line is connected to a sense amplifier, S1-SN. Thus the number of sense amplifiers in this structure equals the number of bit lines, and the number of bits on a page equals the total number of sense amplifiers.

With relatively small memories, eg. nominally 1K or 2K bit storage capacity in size, the bit line and word line addresses could be defined in a manageable single address word. However starting with the 4K bit DRAM and later the 1 megabit DRAM, the number of bit lines and page lines to be addressed became so large that the bit and word line addresses were multiplexed on an address bus. For the 4K bit DRAM, six address bits defined a selected word line out of 64 possible word lines and a further 6 bits defined the 64 bit lines to be addressed. More recently, a 1 megabit memory uses 10 bits for word address followed by 10 bits for column address.

Figure 3:
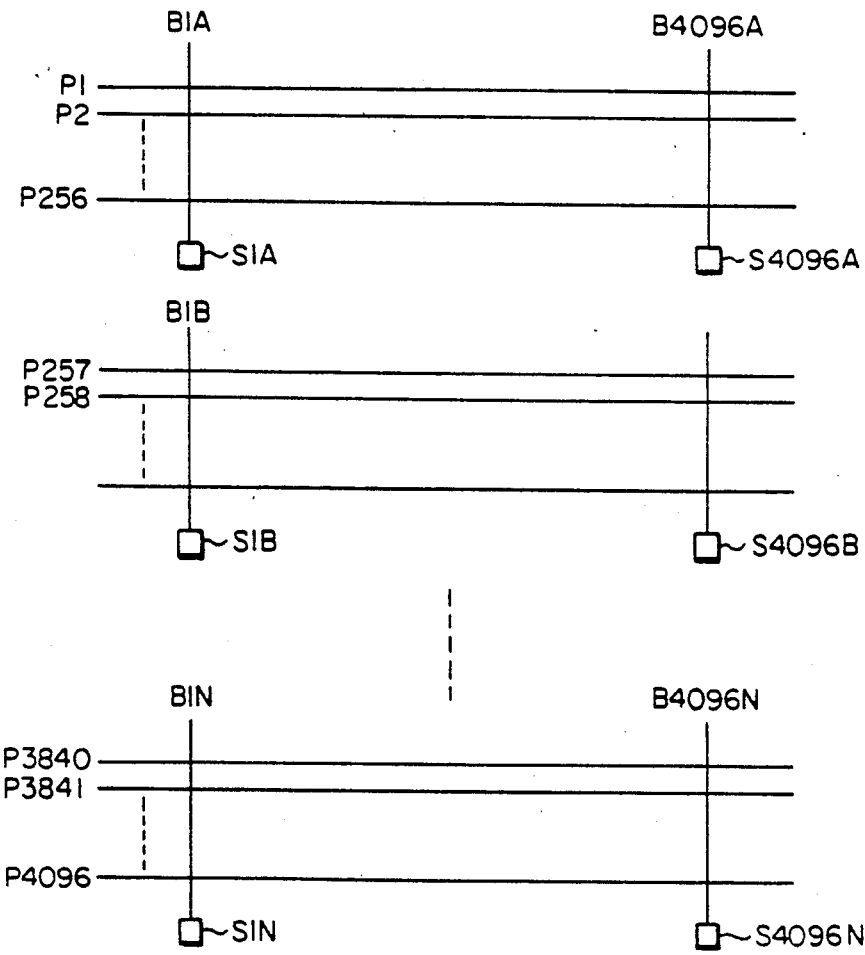

As noted earlier, while the nominally 4K memory had 64 word lines, 64 bit lines and 64 sense amplifiers, one connected to each bit line, for the nominally 1 megabit memory it was not possible to connect 1 sense amplifier to each bit line with 1024 word lines associated with a bit line. The ratio of cell capacitance to bit line capacitance set a practical limit of 256 cells which could be connected to a sense amplifier. Consequently each bit line was subdivided for example as shown in Figure 3. Bit line B1crosses 256 word lines and is connected to sense amplifier B1A. Bit line segment B1B which crosses the next 256 word lines is connected to the next sense amplifier S1B, and so on, with bit line segment B1N intersecting the last 256 word lines connected to sense amplifiers S1N. Each bit line is similarly subdivided. Accordingly for a nominally 1 megabit memory (actually 1,048,576 bits), there are typically 8 blocks each comprising a subset of 512 bit lines and 256 word lines and a total of 8×512=4K sense amplifiers for the entire memory.

A nominally 16 megabit memory is addressed with 12 bits each for the bit and word lines, each word line (or page) having 4096 bits. However because of the 256 cell practical limit noted above, there are 16 times as many sense amplifiers than the number of bits defined by only 12 column address bits. In such a large memory not all of the, say, 16 blocks will be active. Such memories are addressed by means of multiplexed bit and word line addresses on the address bus. Because of the peak current requirements that occurs when a word line address changes, it is not practical to have all sense amplifiers active when a row address change occurs Some groups of word lines are caused to remain in a quiescent state to reduce power supply requirements.

Figure 4:
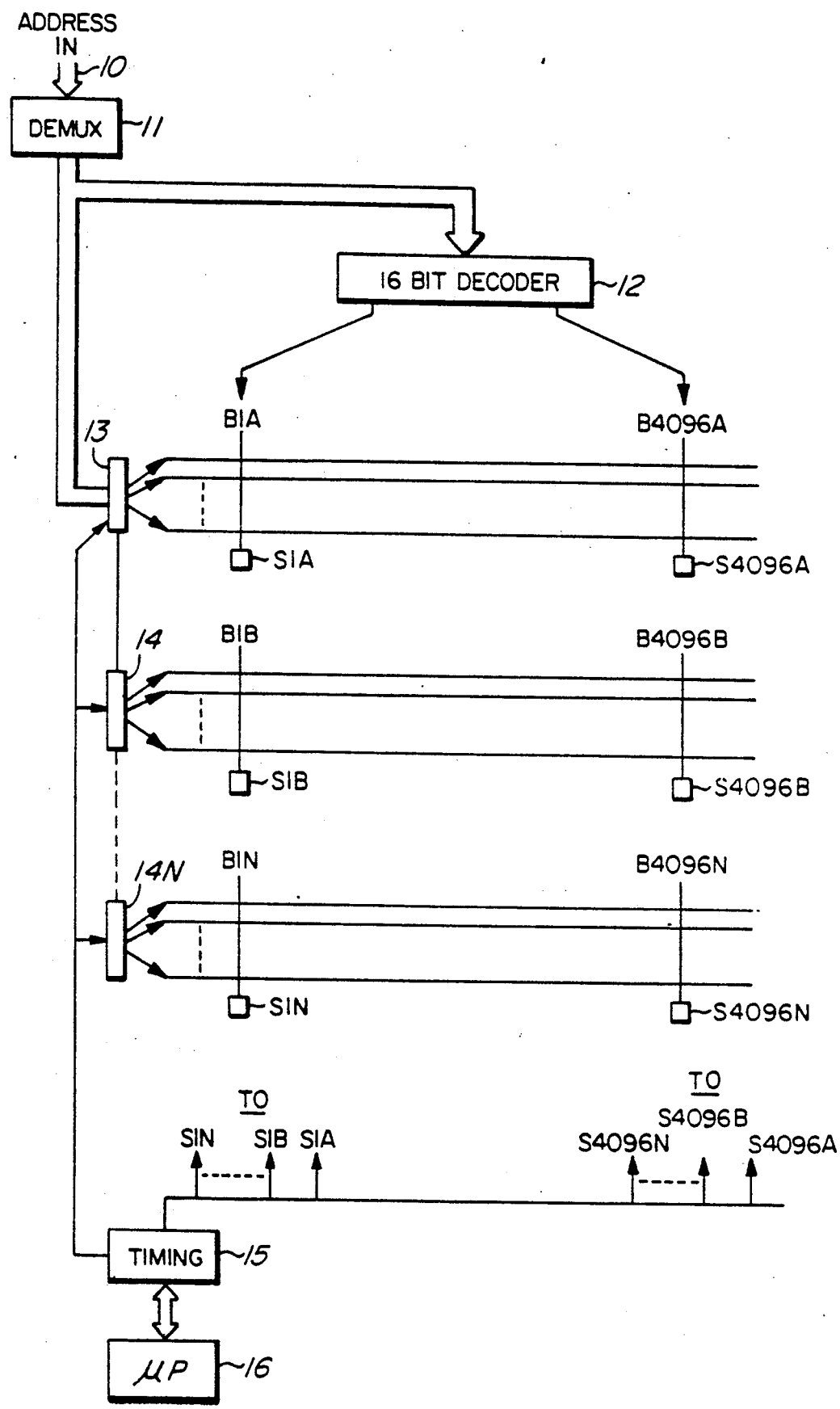

The present invention, an embodiment being shown in Figure 4, substantially reduces the requirements for high power supply currents, and as well allows all of the bits in the maximum possible size of page to be accessed in a page-mode (column address only changing) cycle. All of the sense amplifiers to read a full page of stored bits can remain active at the same time, in contrast to the prior art. Therefore more efficient use of the memory is obtained, while not increasing the power supply requirements, speeding up access to a full page of data.

In the present invention, as in the prior art, the bit lines are subdivided into bit line segments eg. B1A, B1B-B1N....B4096A, B4096B-B4096N, for a nominally 16 megabit memory. Each bit 1 line segment crosses 256 word lines. Each bit line segment is connected to a sense amplifier, i.e. S1A, S1B S1N...S4096A, S4096B-S4096N.

In accordance with the present invention, the word line address is smaller than the bit line address Indeed, it can be nominally as small as the address for the number of word lines crossed by one bit line segment, e.g. 8 bits defining one out of 256 rows. The bit line address for a 16M×1 memory is preferably 16 bits, eg. sufficient to address 65,536 bit lines.

In accordance with the preferred embodiment of the present invention, the large (eg. 16 bit) bit line address follows a smaller word line address. These addresses received on an address bus 10 are demultiplexed in demultiplexer 11, the bit line address being applied to bit line address decoder 12. Bit line decoder 12 addresses all of the bit line segments, 64K in a nominally 16 megabit memory, during page mode operation.

Figure 5:
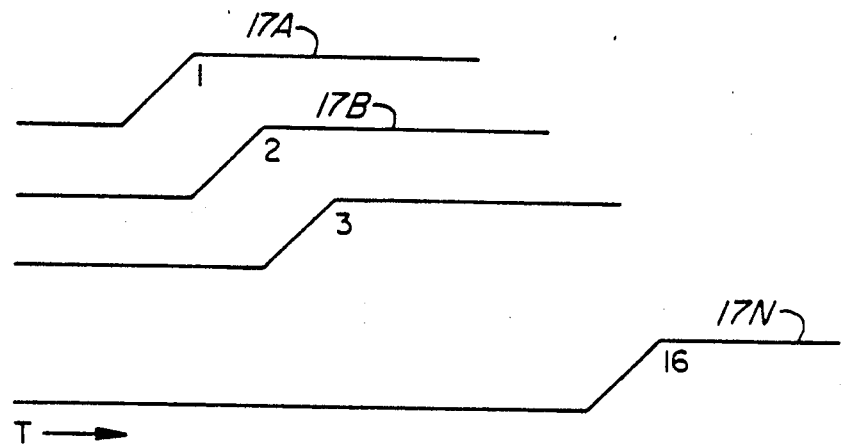

The word line address is demultiplexed in demultiplexer 11, and is applied to a word line address decoder 13. The first group of word lines crossed by bit line segment B1A is addressed. The word line address is then repeated, with delay, in repeater/decoder 14 by which the second group of word lines which is crossed by bit line segment B1B is addressed. The word line address is applied successively through delaying repeater/decoder sequentially, each group of word lines being sequentially addressed. A timing circuit 15 under control of a local processor 16 controls the phased timing of each word line. For example, as shown in FIG. 5, the timing, represented by the rise in the waveform 17A provides earliest clock timing for the decoder 13. The later rise of waveform 17B provides the clock timing for repeater/decoder 14, and so on to waveform 17N which has the most delayed clock timing for repeater/decoder 14N.

The timing circuit 15 operates the group of sense amplifiers S1A-S4096A in synchronism with the timing of decoder 13, then sense amplifiers S1B-S4096B in synchronism with repeater/decoder 14 etc, to S1N-S4096N, each delayed from the preceding group of sense amplifiers, etc.

Since a reduced word line address length is used, which can address one word line in each of the groups associated with the bit line segments, the phased timing operation of the sense amplifiers which correspond to a single group of word lines allows selection of a single word line out of all of the word lines selected in all of the groups.

Thus 8 row address bits followed by 16 column address bits are multiplexed on a 16 bit address bus 10, yet in the manner described above allows page access to all of the bits in the page of memory defined by the eight row address bits. Because the selection of each of the groups is performed with delay one from the other, there is no need to supply a peak power supply current for all of the sense amplifiers simultaneously as was previously required if all of the word lines in all blocks were to be selected simultaneously. Thus the peak current is maintained to a value comparable to that needed in prior art memories with large portions of the memory inactive and so inaccessible to the user in page mode.

Yet the user is afforded high speed access to an entire page of bits associated with each word line address.

Since the address bus accommodates 16 bits (or 12 bits) required to address the bit lines, but the row (word) addresses only require 8 bits, the remaining row address bit capacity can be used for future expansion, for control bits providing special functions, or for test modes. For example special control functions can be accessed by means of control bits, to provide configuration control, ie. determine if the function of the memory has been organized as nominally 16 megabit×1 or nominally 4 megabit×4, etc. The extra bits could be used for masking functions, bit compare functions giving "intelligent memory" operation, etc, at row address time.

One consequence of the present invention, however, is that word line access times are relatively slow by present standards. However this allows internal control of refresh to be achieved without contention during the times that groups of word lines are not being addressed The refresh operation thus can be interleaved in the word line group idle interval while other groups are being addressed. Refresh thus can be effected during the time that a group of word lines awaits its new word line address.

While the description above and the illustration in FIG. 4 has described sequential operation of 16 groups of word lines, the 16 groups can be divided into 2 sets of 8 groups. One word line decoder can be used for each group of 8. The selected word line address must propagate through all 16 groups but there is no need for the sequence to be maintained constant. With a sub-division into two sets of eight groups the phased sequence can begin equally well in either set one or set two. If the on-chip refresh controller has indicated that a refresh cycle must occur at the same time as a word line address change is requested, contention can be avoided by performing refresh in set one while the address change propagates through set two or vice-versa. Thus a refresh operation can be interleaved with normal word line access. Thus refresh interrupt of the processor associated with the memory will never be needed, making its operation more efficient. Refresh is rendered transparant to the user; rather than the memory appearing to be a dynamic random access memory (DRAM), this memory will appear to be "pseudo-static", or "virtual-static".

With refresh handled internally of the memory, refresh can be combined with an automatic system for scrubbing or purging soft errors which can occur in a DRAM. Methods for doing on chip error correction have been published, notably by Nippon Telephone and Telegraph at various ISSCC conferences, and do not form part of the present invention. However correction of errors using 2 dimensional parity checking or hamming codes as data is read from the memory is undesireable. These types of error correction add to access time, hide the effect of any hard errors which may develop, and do not prevent the build up of soft errors in a large memory system. It is preferred that error correction should be combined with the refresh operation as a background task to eliminate soft errors as they occur. Only in the unlikely event of a read out occurring after a soft error, but before the refresh/correction cycle occurred, a time measured in milliseconds, would the output data reflect the occurance of a soft error.

Figure 6:
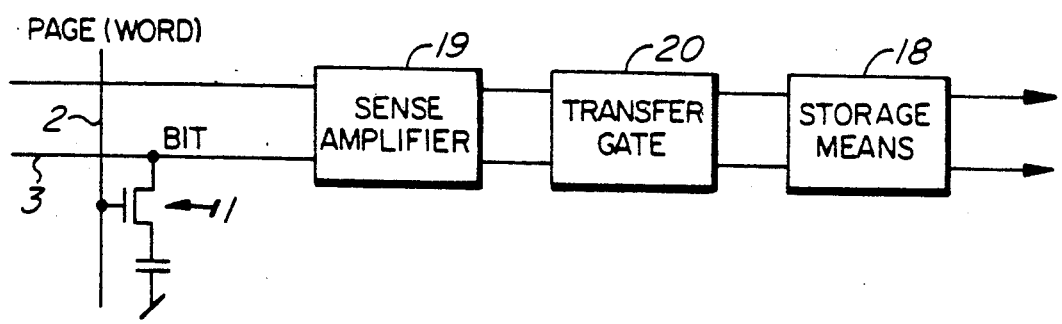

In accordance with another embodiment, as shown in FIG. 6, a row of additional storage cells, or so called SRAM cells 18 is connected to the outputs of the sense amplifiers 19. A row of transfer gates 20 couples the sense amplifiers 19 to the row of SRAM cells 18. This allows the word line addresses to define data, sensed by the sense amplifier and transferred to the SRAMs, allowing reading and writing of data to fit on the page independently of word line access including access for refresh. This achieves the total transparancy of refresh to the user.

A person understanding this invention may now conceive of alternative structures or variations of the described embodiment, using the principles described herein. All are considered to be within the sphere and scope of the invention as defined in the claims appended hereto.

I claim:

1. A DRAM comprised of a matrix of bit lines and word lines, bit storage cells connected to the bit lines and word lines at each matrix intersection, the word lines being grouped into groups, each bit line being divided into bit line segments one associated with each group, an address bus for receiving addresses, means for decoding bit line addresses received on the address bus, means for decoding word line addresses received on the address bus, means for addressing the bit lines by the bit line address, means for addressing a first group of word lines by a word line address, means for separately applying the same word line address to each of the groups of word lines for separately similarly addressing each of the groups of word lines, sense amplifiers for reading all of the bit line segments associated with a group of word lines, and means for enabling said sense amplifiers associated with said group of word lines in relative synchronism with the addressing of said group of word lines.

2. A DRAM as defined in claim 1, in which the number of word lines in each group is the same, and the number of word line address bits is sufficient to address the number of word lines in a group.

3. A DRAM as defined in claim 1 including means for addressing each group of word lines by means of the same word line address with means for time shifted activation of each group in phased sequence, whereby peak current requirements are reduced.

4. A DRAM as defined in claim 1 including means for addressing each successive group of word lines by means of the same word line address time shifted from the preceding group, and in which a sense amplifier associated with each bit line segment is enabled in relative synchronism with the addressing of corresponding groups of word lines.

5. A DRAM comprised of a matrix of bit lines and word lines, bit storage cells connected to the bit lines and word lines at each matrix intersection, the word lines being grouped into groups, each bit line being divided into bit line segments one associated with each group, means for receiving bit and word line addresses, means for decoding said bit line addresses means for decoding said word line addresses means for addressing bit lines by the bit line addresses, means for separately addressing each of the groups of word lines by the same word line addresses, the number of address bits in the bit line addresses being greater than the number of address bits inn the word line addresses, and means for separately sensing the addressed bit lines in relative synchronism with the addressing of the groups of word lines, whereby a system using the DRAM memory chip has access to an enlarged page size.

6. A DRAM comprised of a matrix of bit lines and word lines, bit storage cells connected to the bit lines and word lines at each matrix intersection, the word lines being grouped into groups each bit line being divided into bit line segments associated with each group, a sense amplifier connected to each bit line segment, ann address bus for receiving addresses, means for decoding bit line addresses received on the address bus, means for decoding word line addresses received on the address bus, means for addressing the bit lines by the bit line address, means for addressing a first group of word lines by the word line address, delay means for applying the same word line address to each of the groups of word lines in delayed sequence for similarly addressing each of the groups of word lines delayed one group from the preceding group, and sense amplifiers for reading all of the bit line segments, associated with a group of word lines, and means for enabling said sense amplifiers associated with said group of word lines in relative synchronism with the addressing of said group of word lines.

7. A DRAM as defined in claim 1 including means for providing transparent refresh during phase delay of activating the word lines and sense circuits of sequentially selected blocks from a row address.

8. A DRAM as defined in claim 1 including additional storage means associated with each bit line to allow read and write to occur on the data in a selected page independently of row access and bit sensing.

9. A DRAM as defined in claim 1 including additional storage means associated with each bit line to allow read and write to occur on the data in a selected page independently of row access ad and bit sensing, and data transfer means connected between each sense amplifier and the additional storage means.

10. A DRAM as defined in claim 1 in which bits appearing on the address bus during the word line address, in excess of the number needed for word line address are applied to the DRAM as control signals.

11. A DRAM as defined in claim 1 including means for providing transparent refresh during phase delay of activating the word lines and sense circuits of sequentially selected blocks from a row address, and means for checking for soft errors by error detection coding, and for correcting the error as part of the refresh operation.

12. A DRAM as defined in claim 4 including means for providing transparent refresh during phase delay of activating the word lines and sense circuits of sequentially selected blocks from a row address 13. A DRAM as defined in claim 5 including means for providing transparent refresh during phase delay of activating the word lines and sense circuits of sequentially selected blocks from a row address.

14. A DRAM as defined in claim 4 including additional storage means associated with each bit line to allow read and write to occur on the data in a selected page independently of row access and bit sensing.

15. A DRAM as defined in claim 5 including additional storage means associated with each bit line to allow read and write to occur on the data in a selected page independently of row access and bit sensing.

16. A DRAM as defined in claim 4 including additional storage means associated with each bit line to allow read and write to occur on the data in a selected page independently of row access and bit sensing, and data transfer means connected between each sense amplifier and the additional storage means.

17. A DRAM as defined in claim 6 including additional storage means associated with each bit line to allow read and write to occur on the data in a selected page independently of row access and bit sensing, and data transfer means connected between each sense amplifier and the additional storage means.

18. A DRAM as defined in claim 4 in which bits appearing on the address bus during the word line address, in excess of the number needed for word line address are applied to the DRAM as control signals.

19. A DRAM as defined in claim 6 in which bits appearing on the address bus during the word line address, in excess of the number needed for word line address are applied to the DRAM as control signals.

20. A DRAM as defined in claim 4 including means for providing transparant refresh during phase delay of activating the word lines and sense circuits of sequentially selected blocks from a row address, and means for checking for soft errors by error detection coding, and for correcting the error as part of the refresh operation.

21. A DRAM as defined -in claim 5 including means for providing transparent refresh during phase delay of activating the word lines and sense circuits of sequentially selected blocks from a row address, and means for checking for soft errors by error detection coding, and for correcting the error as part of the refresh operation.

* * * * *